United States Patent [19]

Shah

[11] Patent Number: 5,154,178

[45] Date of Patent: Oct. 13, 1992

[54] METHOD AND APPARATUS FOR OBTAINING IN-VIVO NMR DATA FROM A MOVING SUBJECT

[75] Inventor: Ajit S. Shah, Santa Rosa, Calif.

[73] Assignee: SRI International, Menlo Park, Calif.

[21] Appl. No.: 595,261

[22] Filed: Oct. 9, 1990

[51] Int. Cl.[5] .................................. A61B 5/055
[52] U.S. Cl. .................................. 128/653.2; 324/318; 128/653.5
[58] Field of Search ............. 128/653.2, 653.5, 70-74; 269/322, 328; 324/307, 309, 318

[56] References Cited

U.S. PATENT DOCUMENTS

| | | | |
|---|---|---|---|
| 4,558,278 | 12/1985 | Young | 324/309 |
| 4,568,880 | 2/1986 | Sugimoto | 324/309 |
| 4,724,386 | 2/1988 | Haacke et al. | 324/309 |
| 4,730,620 | 3/1989 | Bailes | 128/653 |
| 4,830,012 | 5/1989 | Riederer | 128/653 |
| 4,832,037 | 5/1989 | Granot | 128/653 |
| 4,834,112 | 5/1989 | Machek et al. | 128/777 |
| 4,878,499 | 11/1989 | Suzuki et al. | 128/653 A |
| 4,895,157 | 1/1990 | Nambu | 128/653 A |
| 4,903,704 | 2/1990 | VanEngermond et al. | 128/653 A |
| 4,905,699 | 3/1990 | Sano et al. | 128/653 A |
| 4,930,508 | 6/1990 | Shimoni et al. | 128/653 A |
| 5,007,425 | 4/1991 | Vanek et al. | 128/653 SC |
| 5,042,487 | 8/1991 | Marquardt | 128/653 SC |
| 5,085,219 | 2/1992 | Ortendahl et al. | 128/653.5 |

FOREIGN PATENT DOCUMENTS

| | | | |
|---|---|---|---|
| 0228129 | 7/1987 | European Pat. Off. | 128/653 A |
| 0291387 | 11/1988 | European Pat. Off. | 128/653 A |
| 3421045 | 12/1985 | Fed. Rep. of Germany | 128/653 A |
| 3835111 | 4/1989 | Fed. Rep. of Germany | 128/653 A |

OTHER PUBLICATIONS

The MRI Manual—R. B. Lufkin, Year Book Medical Publishers, Inc. 1990 pp. 99-101.
Icenogle et al., "Book of Abstracts vol. 1" Society of Magnetic Resonance in Medicine, Eighth Annual Meeting and Exhibition, Aug. 12-18, 1989 Amsterdam, The Netherlands.

Primary Examiner—Lee S. Cohen
Assistant Examiner—K. M. Pfaffle
Attorney, Agent, or Firm—Victor R. Beckman

[57] ABSTRACT

Apparatus for obtaining in-vivo nuclear magnetic resonance data from a moving joint of a patient for imaging or spectroscopic purposes is shown which includes a support (10) for support of the patient's hand and lower arm (12). Support (10) includes a stationary section (20) and a pivotally movable section (22) which is oscillated by motor (32). A pivot shaft (26) supports member (22) for pivotal movement in the direction of arrow (30) about the shaft axis (28). Straps (14) and (16) attach the patient's hand and forearm to the respective moving and stationary sections of the support whereby the patient's wrist joint is oscillated along a predetermined path during operation of motor (32). A timing cylinder (40) with timing marks thereon is attached to shaft (26), for generation of master timing pulses by photocell (44) responsive to the timing marks through fiber optic member (42). Nuclear magnetic resonance apparatus of conventional design generates magnetic fields within region (52) at the patient's wrist, and detects nuclear magnetic signals produced by the magnetic fields. Master timing pulses control operation of the magnetic resonance apparatus during oscillation of the wrist joint for production of imaging or spectroscopic signals at different points along the path of wrist movement. For operation in the imaging mode, a motion picture display of the moving wrist joint is provided at display (78). In the spectroscopy operation mode, spectrum data is displayed at display (78).

20 Claims, 3 Drawing Sheets

METHOD AND APPARATUS FOR OBTAINING IN-VIVO NMR DATA FROM A MOVING SUBJECT

FIELD OF THE INVENTION

This invention relates generally to nuclear magnetic resonance (NMR) method and apparatus for acquiring invivo magnetic resonance data from a subject while a body part, such as a joint or the like, of the subject is undergoing movement along a path. Either imaging or spectroscopic data may be acquired for display.

BACKGROUND OF THE INVENTION

Magnetic resonance imaging systems are well known as shown, for example, in U.S. Pat. Nos. 4,830,102 Riederer, 4,568,880—Sugimoto, and 4,558,278—Young. well known as shown in U.S. Pat. No. 4,832,037 Granot. Motion artifact correction schemes for reducing motion artifact from naturally occurring physiologic motion are well known which include monitoring of periodic respiratory or cardiovascular motion, and using the information to synchronize the duty cycle of the NMR apparatus with the motion Also, the order of the phase encoding may be arranged to reduce motion artifacts. Motion artifact correction schemes of the above-mentioned type which include use of a monitor signal are disclosed in U.S. Pat. No. 4,724,386. Method and apparatus for synchronizing operation of the NMR pulse sequence with the cardiac cycle are shown in U.S. Pat. No. 4,903,704 by Van Eggermond et al.

With prior art arrangements, it is possible to obtain images of, say, the heart at various points in the cardiac cycle by use of electrocardiogram gating of the magnetic resonance imaging (MRI) apparatus. A motion picture display of the heart is provided using images obtained at the different points in the cardiac cycle. Such techniques rely upon the existence of a natural physiologic signal, or natural periodic motion from which a timing signal may be derived, to obtain images of the moving object, and are not applicable to imaging of body parts not subjected to involuntary periodic motion.

Also, simulated motion of a joint is well known wherein a plurality of stationary NMR images of the joint are acquired with the joint at different spatial positions, each image being obtained while the joint is stationary. The images then are displayed in succession at a rapid rate to simulate motion of the joint. However, such techniques do not capture dynamic information obtained during joint movement, and do not provide an indication of changes which may occur over the course of time as a result of continued movement of the joint.

Prior art dynamic MRI has been limited to use with timing signals derived from naturally occurring physiologic signals, or motion, of the patient. This greatly limits the application of the MRI technique. For example, to obtain images of a moving appendage, joint, or articulation, there is no naturally occurring physiologic signal that may be employed to gate the NMR system. If there is clinical information or pathology that is observable only during motion, it is important to obtain imaging and/or spectroscopic information during motion for proper diagnosis. In brief, in the absence of naturally occurring physiologic signals to gate the NMR system, prior art MRI and MRS techniques are incapable of capturing dynamic information resulting from recurrent voluntary, or induced voluntary, motion of the patient.

SUMMARY AND OBJECTS OF THE INVENTION

An object of this invention is the provision of improved NMR method and apparatus which avoid the abovementioned problems and shortcomings in the in vivo examination of the effects of motion of a body part such as a joint of a subject encountered in prior art NMR arrangements.

An object of this invention is the provision of NMR method and apparatus of the above-mentioned type which includes novel means for generating gating pulses for synchronizing the duty cycle of the NMR pulse sequence with voluntary or induced voluntary motion of the patient in the absence of naturally occurring physiologic motion or signals.

An object of this invention is the provision of NMR method and apparatus for obtaining dynamic imaging and/or spectroscopic data from a region of a patient affected by recurrent movement of a body part along a path, which data is acquired during such movement.

In one embodiment, the NMR method and apparatus of the present invention includes use of support means comprising first and second relatively movable support members attachable to a subject at opposite sides of a body part such as a joint, and which limit movement of the joint along a predetermined path. Movement of the body part is controlled independently of the subject's respiratory and involuntary muscle movements. The support means may be motor-driven for recurrent movement of the joint along said path. Master timing pulses are produced dependent upon position of the support means. NMR means are provided for generating magnetic fields at a location affected by movement of the joint for causing a NMR phenomenon thereat. The NMR phenomenon may be produced directly at the joint or at a location removed from the joint but affected by the recurrent joint movement. NMR signals produced by the NMR phenomenon are detected, and either imaging data or spectroscopic data is acquired dependent upon the sequence employed in the generation and detection of the NMR phenomenon. Numerous NMR sequences for MRI and MRS are known which may be employed with the present invention. A motion picture display of the joint may be provided by obtaining separate images of the joint at a plurality of points of travel thereof along said predetermined path, then displaying the images in rapid sequence for generation of a motion picture display thereof. Alternatively, data for image or spectroscopic display may be obtained when the joint is at a single point in travel along the predetermined path. Physiologic changes which may occur during such operation may be observed in changes in the display over time.

BRIEF DESCRIPTION OF THE DRAWINGS

The above and other objects and advantages of the invention will be better understood from the following description when considered with the accompanying drawings. It here will be understood that the invention is not limited to the embodiment thereof illustrated in the drawings. In the drawings, wherein like reference characters refer to the same parts in the several views.

Figure 1:
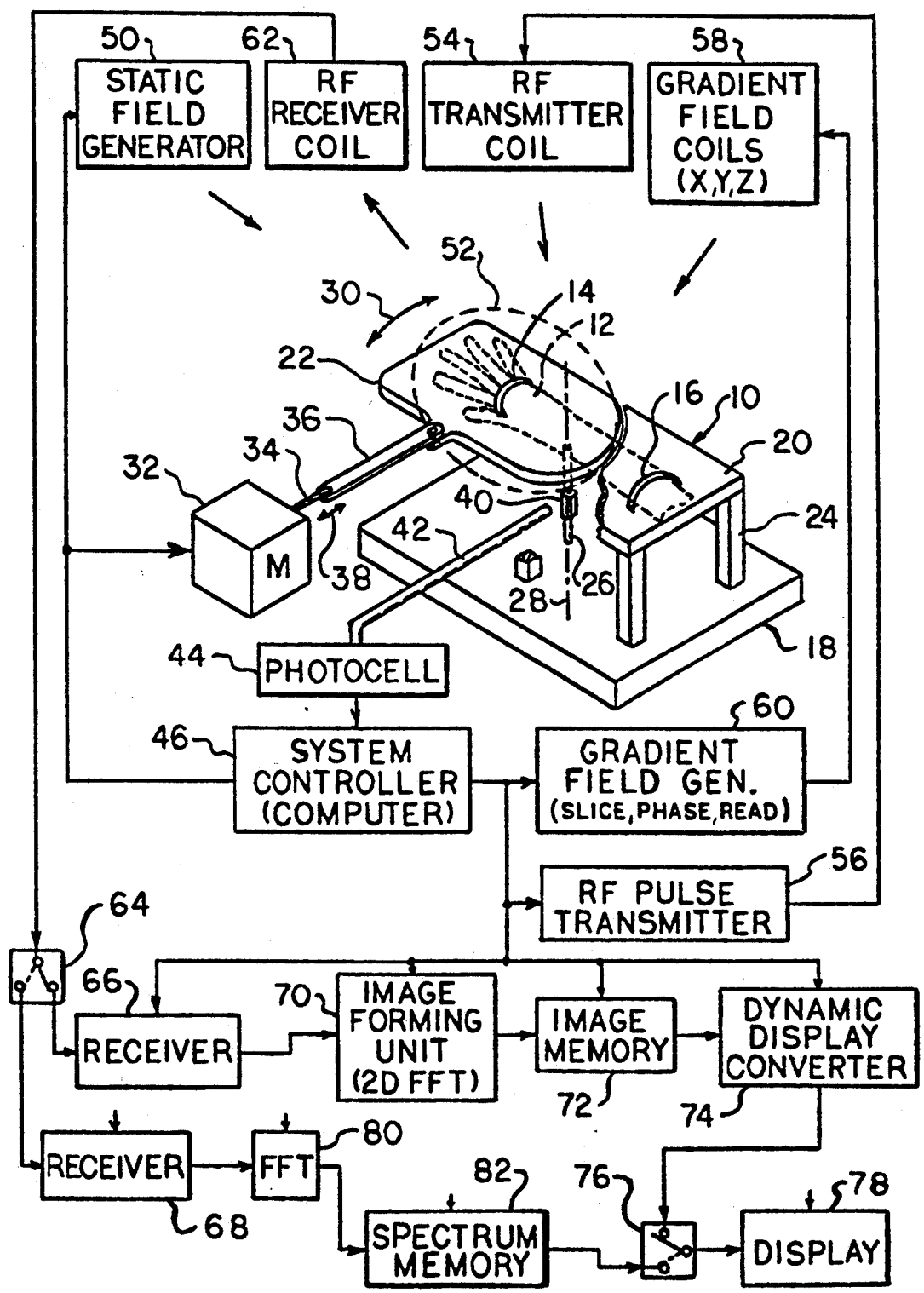
FIG. 1 is a combination isometric and block diagram showing a NMR medical examination apparatus which embodies the present invention, parts of the apparatus being shown broken away for clarity.

Reference first is made to FIG. 1 wherein the novel NMR examination apparatus of this invention is shown comprising support mean s 10 which is attachable to a subject adjacent to a joint to be examined using either magnetic resonance imaging (MRI) or magnetic resonance spectroscopy (MRS) techniques. For purposes of illustration the lower arm and hand 12 of a subject, shown in broken lines, is shown attached to the support means by use of straps 14 and 16 at opposite sides of the wrist.

Support means 10 includes base member 18 for the support of first and second relatively movable support members 20 and 22, the upper faces of which are at the same level above base member 18. Legs 24 support the first support member 20 at a fixed, raised, position above base member 18. Second support member 22 is affixed to a downwardly extending shaft 26 which is journaled at base member 18 for pivotal movement about the shaft axis 28. Movable member 22 oscillates in the direction of arrow 30 under control of motor 32 for recurrent pivotal movement of the subject's wrist. Motor 32 includes a reciprocating motor shaft 34 coupled by connecting link 36 to movable member 22. Pivotal connecting means at opposite ends of connecting link 36 couple the same to the motor shaft 34 and movable support member 22. Back and forth rectilinear movement of motor shaft 34 in the direction of arrow 38 produces recurrent oscillating motion of second movable support member 22 in the direction of arrow 30 and, as noted above, oscillating motion of the subject's wrist joint.

Timing means for the generation of master timing pulses for controlling operation of associated NMR apparatus are provided. In the exemplary arrangement shown in FIG. 1, the timing means includes a timing cylinder 40 affixed to pivotal shaft 26, which cylinder is provided with longitudinally extending timing lines at the outer face thereof. A fiber-optic member 42 having one end adjacent to the timing cylinder is connected to a photocell 44 for production of master timing pulses dependent upon the position of support member 22 and, consequently, of the subject's joint. Master timing pulses from photocell 44 are supplied to a system controller 46 of NMR apparatus for controlling timing of the system operation. Operation of motor 32 also may be under control of controller 46. A computer may be employed as the system controller as in prior art NMR arrangements. At least that part of the abovedescribed apparatus which is located in the magnetic field volume of the NMR apparatus is made of non-magnetic material so as to produce no, or little, electromagnetic interference in the NMR operation.

NMR apparatus for generating magnetic fields for causing NMR phenomenon in the subject, and for detecting NMR signals produced by the NMR phenomenon for acquiring magnetic resonance data from a selected region may be of conventional design. For purposes of illustration, the NMR apparatus is shown to include a static field generator 50 for generating a strong, generally uniform, main magnetic field which extends through the region 52 under examination which, in the illustrated arrangement includes the patient's wrist. A radio frequency (RF) transmitter coil 54, is supplied with radio frequency pulses by RF pulse transmitter 56 operating at a predetermined frequency for exciting magnetic resonance at region 52. Gradient field coil means 58 connected to gradient field generator means 60 are used to selectively apply gradient magnetic fields to region 52 which are superimposed on the static magnetic field. Gradient field coil means 58 includes X, Y and Z coils for generation of three orthogonally oriented physical gradients Gx, Gy and Gz, any one, or combination, of which may be employed for slice selection, phase and frequency encoding. In the illustrated system, gradient field generator means 60 provides slice selection, phase encoding, and frequency encoding signals to the X, Y and Z coils for generation of slice, phase and frequency gradients, G-slice, G-phase and G-frequency, respectively. The G-slice gradient is used for slice selection within region 52, and the G-phase and G-frequency gradients encode spatial position in the selected slice. The gradient fields, together with the static and RF fields cause a NMR phenomenon within the patient. Often, but not necessarily, for MRI purposes, the system is operated at the resonant frequency of hydrogen-I.

An RF receiving coil 62 is provided for acquiring RF signals produced as a result of the NMR phenomenon, which signals are supplied to a switch 64. Obviously, the RF receiving coil may comprise a surface coil, if desired, and may also be the same coil as the transmit coil as is often done in conventional design. In the illustrated full line position of switch 64, the received signal is supplied to receiver 66 included in an image producing system, and in the broken line position of switch 64 the received signal is supplied to receiver 68 included in a spectroscopic system. For imaging, NMR signals are received and supplied to receiver 66 where they are demodulated and converted to digital signal form. The digitized echo signals are loaded into a 2D data acquisition matrix included in receiver 66. Typically, a plurality of phase encoding steps are required to form an image. When all phase encoding steps for an image are completed, data stored in the matrix is supplied to an image forming unit 70 comprising, for example, a digital computer for performing a two-dimensional fast Fourier transform (2D FFT) thereon. Here, the phase-frequency information is mapped into the image by location and the signal amplitude for each pixel is used to control image brightness. The resultant image is stored in image memory 72.

In the illustrated arrangement, wherein the subject's wrist joint is oscillated back and forth along a predetermined path by operation of motor 32, images of the joint are obtained when the joint is at a plurality of different locations along the path of travel. For example only, an image may be obtained when the joint is at the illustrated neutral position shown in FIG. 1, and at every 10 degree interval of pivotal motion thereof to the left and to the right thereof. The angular spacing of timing marks on timing cylinder 40 determines the angular positions at which master timing pulses for controlling operation of the NMR apparatus are generated and, therefore, control the angular positions at which the images are obtained. Images obtained for each position along the path of travel are supplied to dynamic display converter 74 where successive images are rapidly read from image memory 72 and connected through switch 76 to display 78 to provide for a motion picture display of the moving wrist joint For NMR spectroscopy operation, switches 64 and 76 are moved to the illustrated broken line position, and the system is tuned for operation with some element, such as hydrogen-1, phosphorus-31, sodium-23, carbon-13, or the like. At receiver 68, RF signals from the sample picked up by receiver coil 62 are demodulated and converted to digital signal form. The output from receiver 68 is transformed to the frequency domain by Fast Fourier Transform (FFT) unit 80. The frequency spectrums obtained from FFT 80 during oscillating movement of the wrist joint are stored in spectrum memory 82 and, from memory 82 are supplied to display 78 through switch 76. With this arrangement, changes which occur over a time period during which the wrist joint is recurrently moved may be observed at the display. Also, by obtaining spectroscopic information with the wrist joint at different positions along the path of travel, differences in the spectrum with the wrist at different positions also may be observed Display of spectrums obtained with the wrist at different positions are labelled with the position. Timing pulses for controlling elements of the MRS system are supplied by system controller 46 which, in turn, is supplied with master timing pulses from photocell 44.

Operation of the system shown in FIG. 1 in the imaging mode now will be described with reference to the pulse sequence timing diagram of FIG. 2. To dynamically image a subject's wrist, the subject's hand is attached to movable support member 22 by strap 14, and the subject's arm at a location above the wrist is attached to stationary support member 20 by strap 16. Motor 32 then is energized to provide an oscillating motion to movable member 22 and to the subject's hand supported thereon, for oscillating motion of the wrist joint. Master timing pulses 92 are produced at the output of photocell 44 which is responsive to timing marks on timing cylinder 40 attached to pivoting shaft 26. For purposes of illustration, master timing pulses are shown produced every 10 degrees of rotation of movable support member, which timing pulses are supplied to system controller 46 for use in controlling operation of the associated NMR apparatus. Again for purposes of illustration only, operation of the NMR apparatus using a spin echo pulsing sequence is shown, which sequence r includes use of a 90° RF pulse followed by a 180° RF pulse. Also, for simplicity of illustration, single-slice operation is illustrated. Obviously, multi-slice operation may be employed, if desired.

Figure 2:
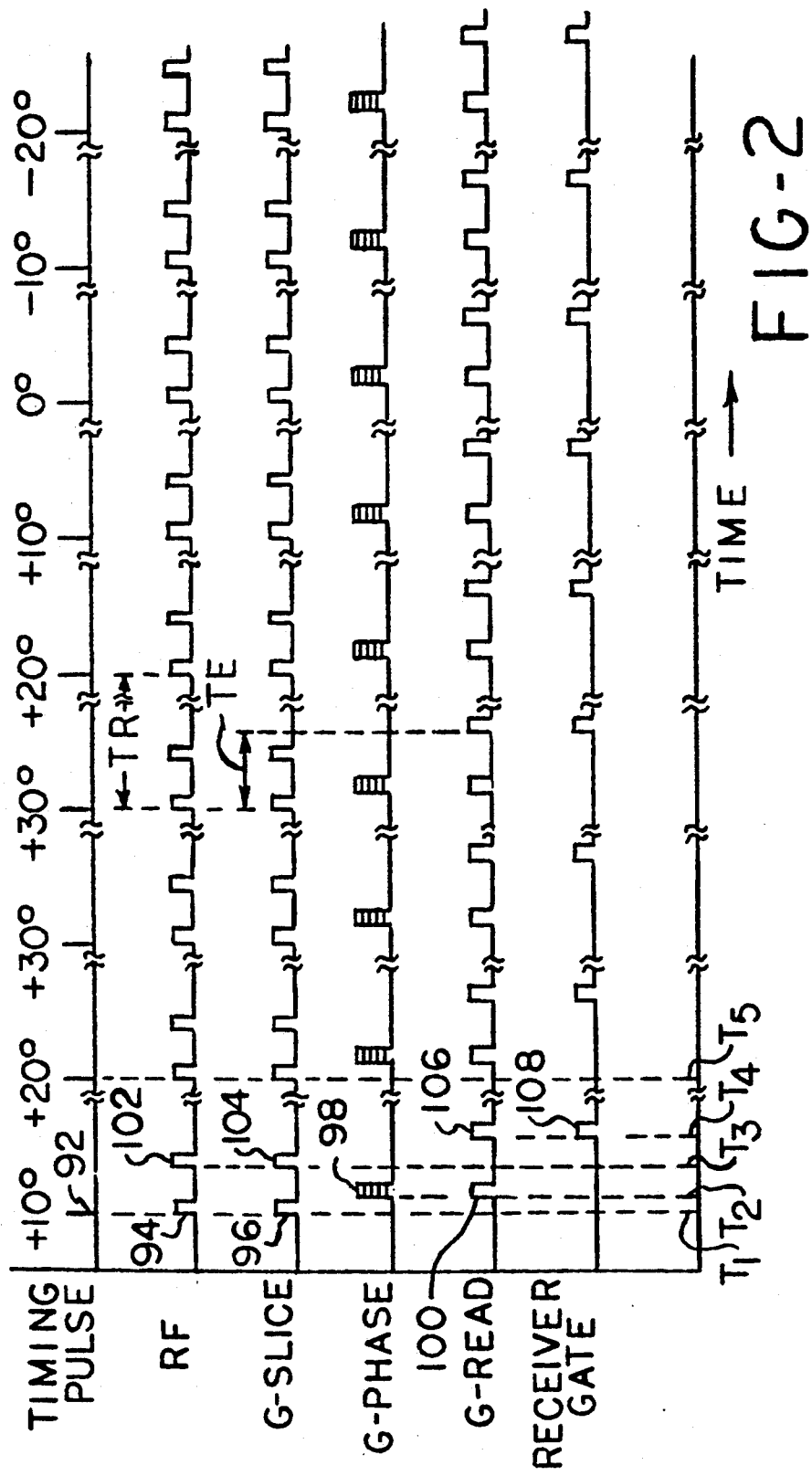
FIG. 2 is a pulse sequence timing diagram for use in explaining operation of the apparatus of FIG. 1 for magnetic resonance imaging.

As seen in FIG. 2, a timing pulse 92 is generated at time $T_1$ at a wrist joint rotation of 10° in the clockwise direction; the + and − signals in FIG. 2 indicating clockwise and counter-clockwise position from the central, 0°, wrist position. In response to said timing pulse, a 90 degree RF pulse 94 is applied to region 52 from transmitter 56 via RF transmitter coil 54 for rotation of the net magnetization vector of hydrogen proton spins 90 degrees. Simultaneously, during RF pulse operation, a slice gradient field 96 is applied for slice selection within region 52. Next, at time $T_2$ a phase encoding gradient 98 is applied for phase encoding purposes. Simultaneously, a frequency, or read, gradient 100 is applied. At time $T_3$ the 180 degree RF pulse 102 and slice gradient 104 simultaneously are applied. Then, at time $T_4$ frequency gradient 106 is applied for the purpose of rephasing the spins and generating a spin echo. During application of frequency gradient 106, receiver 66 is gated on by receive gate signal 108 for collection of spin echo signals Next, at time $T_5$, when the wrist joint reaches 20 degrees rotation in a clockwise direction, the above-described pulse sequence is repeated for obtaining information for use in forming another image of the wrist. As is well understood, in practice other compensatory gradients are applied during operation which, for simplicity, are not shown in the simplified pulse sequence timing diagrams included herein.

Under control of master timing pulses 92, information for forming an image at every 10 degree interval of wrist motion during both clockwise and counterclockwise rotation is obtained. In the illustrated single-slice operation, information for a total of 14 images is obtained with rotation of the wrist joint 30 degrees either direction from the central neutral position. Depending upon the rate of oscillation of the wrist, and the minimum repetition time, TR, needed to obtain adequate density (contrast) resolution, it may not be possible to obtain imaging information for 14 images with each cycle of the wrist In such a case, alternate timing pulses may be employed, for example, to obtain information for 7 images, after which the other alternate timing pulses may be employed to obtain information for the remaining 7 images.

Figure 3:
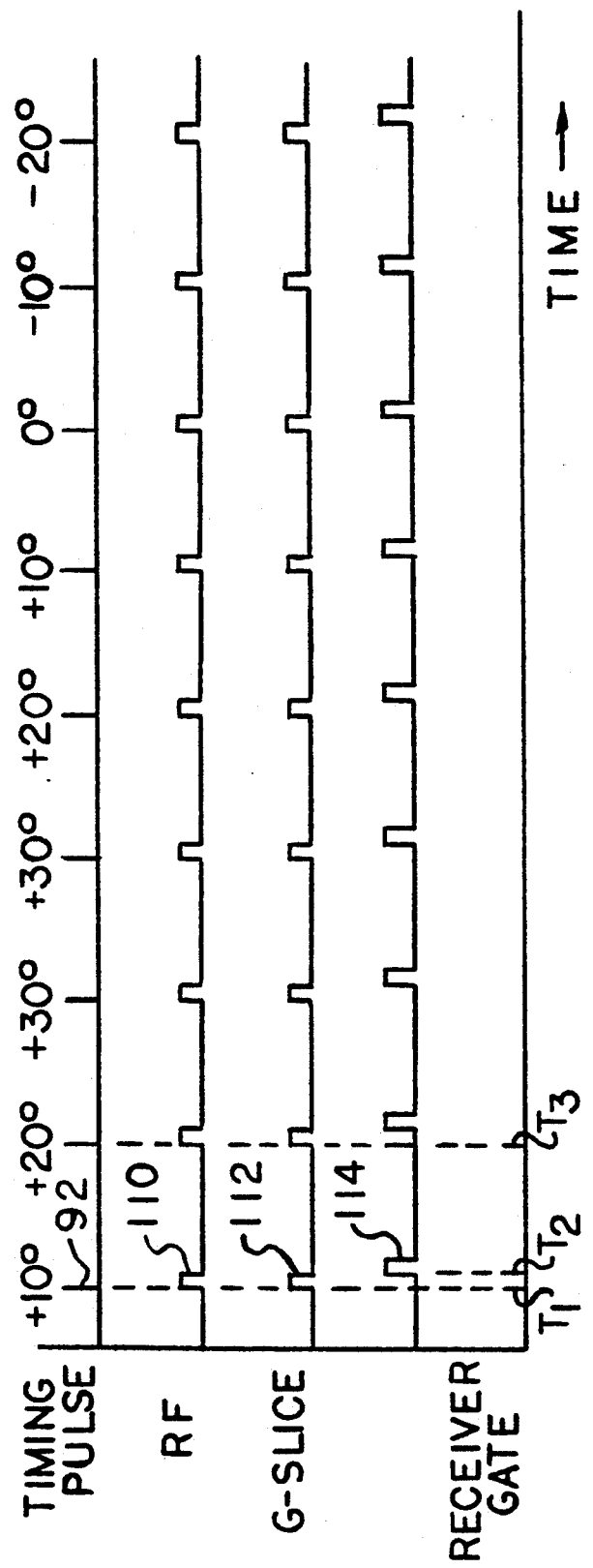
FIG. 3 is a pulse sequence timing diagram which is similar to that of FIG. 2 but showing operation for magnetic resonance spectroscopic examination.

As is well understood, the slice select and frequency (or readout) gradients are kept constant while the phase encoding gradient is stepped through many different levels to obtain enough information for a complete image. At receiver 66, signals are demodulated and converted to digital signal form. When data for a complete image has been collected at a data acquisition memory included in the receiver, it is supplied to image forming unit 70 where it is transformed in two dimensions by 2D FFT. The two-dimension image data is stored in image memory 72 and, from there, is supplied to dynamic display converter 74 for conversion into a motion picture display of the individual images. The motion picture display is supplied through switch 76 to display 78. Obviously, recording of the information for subsequent playback also is contemplated Referring now to the pulse sequence timing diagram of FIG. 3 illustrating spectroscopy operation in the MRS mode, a timing pulse 92 generated at time $T_1$ during rotation of the wrist joint in a clockwise direction results in the generation of a RF pulse 110 which is applied to region 52 for rotation of the net magnetization vector of, say, phosphorus nuclei spins away from its equilibrium position. A ninety degree RF pulse may be used. Simultaneously, during RF pulse operation, a slice gradient field 112 is applied for slice selection within region 52. Then, at time $T_2$, receiver 68 is gated on by receiver gate signal 114 for receiving the RF signal from the sample generated in receiver coil 62. (As noted above, switches 64 and 76 are moved to the broken line position for operation in the MRS mode.) At time $T_3$, the pulse sequence is repeated for obtaining spectroscopy information when rotation of the wrist joint reaches 20 degrees in the clockwise direction. The operation is repeated at every 10 degree interval of wrist motion as in the MRI operating mode described above.

At receiver 68, the signals are demodulated and converted to digital signal form. As is well understood, received signals from elements such as phosphorus are substantially weaker than those from hydrogen because of the lower natural abundance thereof in the body. To improve the signal to noise ratio (SNR) signal averaging commonly is used wherein the sequence is repeated many times and received signals are summed whereby the nonrandom signal is increased by a greater amount than random noise. Averaging may be performed at the receiver. Then, at FFT 80, a fast Fourier transform is performed for transformation to the frequency vs. amplitude domain. Output from FFT 80 is supplied to display 78 through memory 82 and switch 76 for graphical display of the different frequencies identifying different chemical species in the selected slice.

In the illustrated spectroscopic examination method, the same slice gradient is used at each wrist position to be examined Different slices may be examined by using different slice gradients at the different wrist positions. Also, two or more sets of spectroscopic signals may be obtained for each wrist position simply by repeating the above-described spectroscopic examination process, which sets may be examined for changes which may occur over time during movement of the joint. Also, other pulse techniques for increased localization of the MRS signal may be employed in place of the illustrated operation in which the sample includes an entire slice. Standard localization techniques are well known.

Loading of the joint during recurrent mechanical movement thereof during the NMR examination may be provided simply by having a subject apply a bending force at the joint. The direction of force may be in any direction that the subject is capable of applying such a force. For a wrist joint, a component of force in the direction of movement, opposite the direction of movement, or normal thereto all are possible It will be apparent that the motion and loads employed in the practice of this invention may simulate real-life situations such as the swinging of a tennis racquet, slicing, sawing, sewing, or the like.

The invention having been described in detail in accordance with requirements of the Patent Statutes, other changes and modifications will suggest themselves to those skilled in this art. As noted above, the NMR apparatus is not limited to operation using the pulse sequences shown in FIGS. 2 and 3, which are for purposes of illustration only. In practice, compensatory gradients also are included in the pulse sequence to off-set dephasing effects of the slice select gradient In addition to the use of compensatory gradients, many other pulse sequences are known which may be employed in the operation of the NMR apparatus. For example, although the MRS operation illustrated in FIG. 3 employs only 90 degree RF pulses, a spin echo sequence of the type shown in FIG. 2 may be used wherein a 180 degree pulse is applied following the slice select gradient, after which the receiver is gated on during generation of the spin echo.

Instead of spin echo operation, a field, or gradient, echo technique may be used wherein the magnetic field gradients are reversed to provide for rephasing. This technique allows for very fast scanning, with repetition times as short as 30 msec. Often flip angles less than 90 degrees are employed for improved signal-to-noise ratio. Fast MR scanning techniques include GRASS (gradient recalled acquisition in a steady state) and FLASH (fast low-angle shot) scanning. Also, multiecho operation may be employed wherein a second 180 degree pulse is applied during the repetition time, TR, and a second spin echo is collected and separately processed. The second image obtained is displaced from the first image due to movement of the joint between the time of receipt of the first and second echoes, and the additional image may be included in the motion picture display. Additionally, echo planar imaging may be employed whereby complete image encoding is acquired from a train of successive spin echoes within one transmitreceive interval. With this operation, successive spin echoes in a given acquisition line are used to encode position information, rather than phase encoding a separate line of data with every transmit-receive interval. Using this technique, an entire image is acquired for each transmit-receive operation initiated by a master timing pulse.

With the present invention signal averaging may be employed for improving the signal to noise ratio whereby echo signals obtained when the body part is at the same position during movement thereof are summed. Without generation of timing signals when the moving body part is at the same position during recurrent movement thereof, such signal averaging would not be possible. Signal averaging is of particular significance using echo planar imaging or other techniques wherein an entire image is generated in a short time period.

As noted above, multi-slice operation may be employed if desired, which operation includes repetition of the pulse sequence described for a different value of the RF center frequency so as to obtain an NMR signal from an associated slice potentially but not necessarily adjacent to the first slice. By employing different frequency 180 degree RF pulses, the collection of additional RF signals from different slices during a transmit-receive period is provided.

It will be apparent that the invention is not limited to examination of the moving joint. Spectroscopic or imaging signals also may be obtained from a volume which is affected by joint movement without obtaining spectroscopic or imaging signals from the joint itself. Such examination may be made of either the moving or stationary side of the moving joint. Also, NMR imaging when the joint is at a single predetermined position along the path of travel thereof is contemplated, instead of at a plurality of positions as illustrated.

Recurrent movement of joints other than the wrist is contemplated including, for example, finger, toe, elbow, knee, jaw, shoulder and hip joints Modification of support means 10 to accommodate other body parts for controlling joint movement is well within the ability of one skilled in this art. Also, the invention is not limited to the illustrated oscillatory motion in a plane. Movement of the wrist, and other joints, in three dimensions rather than only two dimensions also is contemplated. Regardless of the type of movement employed, it is required that the joint be at the same physical position during corresponding timing pulses to minimize motion artifacts for those NMR pulse sequences requiring a plurality of views (or phase encoding steps) to produce an image.

Also, other means for generating master timing pulses dependent upon position of the movable support means and associated joint may be employed including either open or closed loop systems. If a stepping motor 32 is employed, and if there is a direct correlation between the motor shaft position and motor drive signal, then timing signals may be derived from the motor drive signal rather than from a movable timing element attached to the movable support member.

Any suitable motor means such as a fluid or electric motor may be employed. If the motor means is located within the magnetic field, a motor which does not interfere with the creation and detection of the NMR signal is required. A motor which includes magnetic material may be employed if it is located outside the magnetic field volume of the NMR apparatus.

If desired, the movable member of the support means to which the patient is secured may be moved directly by the patient instead of by means of motor 32. For this operation, motor 32 and associated coupling means may be eliminated from the arrangement, if desired. With such an arrangement movable support member 22 may be resiliently biased toward a predetermined position, or may be connected to motion damping means, such as shock absorber means, thereby exerting loading forces on the joint during recurrent movement along the path of travel. However, the repetition time (TR) of the NMR system may vary depending upon the rate of movement provided by the patient. Also, as noted above, RF coil 54 may be used for both transmitting and receiving purposes, thereby eliminating the need for a separate RF receiving coil 62. In addition, position sensing means for use in synchronizing the NMR pulse sequence with position, which sensing means are independent of, and do not require use of support means, may be employed so long as it does not interfere with operation of the NMR system.

It is intended that the above and other such changes and modifications shall fall within the spirit and scope of the invention as defined in the appended claims.

I claim:

1. Medical examination apparatus for examining the effect of motion of a body part such as a joint of a subject at a region of the subject affected by said motion comprising,
    support means attachable to the subject for controlling movement of the body part along a path,
    means for producing master timing pulses dependent upon at least one of a plurality of positions of the support means during said movement of the body part along said path,
    NMR means for generating magnetic fields including static and high frequency fields for application to the subject at said region for causing a NMR phenomenon thereat, and for detecting NMR signals produced by said NMR phenomenon, and
    means for controlling the NMR means in response to the master timing pulses for recurrent operation of said NMR means during said movement of the body part along said path.

2. Medical examination apparatus as defined in claim 1 wherein said means for controlling the NMR means includes means for operation of the NMR means when the body part is at a single one of the positions along said path.

3. Medical examination apparatus as defined in claim 1 wherein the NMR signals produced by said NMR phenomenon comprise RF signals that are detected by said NMR means, and
    said NMR means comprises magnetic resonance imaging means for production of images in response to said RF signals.

4. Medical examination apparatus as defined in claim 3 wherein said RF signals comprise spin echo signals.

5. Medical examination apparatus as defined in claim 3 wherein said RF signals comprise gradient echo signals.

6. Medical examination apparatus as defined in claim 3 wherein said means for controlling the NMR means includes means for operation of the NMR means when the body part is at a plurality of different positions along said path for production of images of the moving body part when at different positions along the path.

7. Medical examination apparatus as defined in claim 6 including means for providing a motion picture display of the images produced when the moving body part is at said different positions.

8. Medical examination apparatus as defined in claim 1 wherein said support means is non-magnetic, and at least a portion thereof is located in the magnetic fields generated by said NMR means.

9. Medical examination apparatus as defined in claim 1 including motor means for actuating said support means for moving the body part along said path.

10. Medical examination apparatus as defined in claim 1 wherein said support means comprises first and second support members, and further comprising
    means for interconnecting said support members for relative movement thereof,
    means for attaching said first and second support members to the subject at opposite sides of the joint, the first support member being relatively stationary to the NMR means, and the second support member being relatively movable to the NMR means during operation 11. Medical examination apparatus as defined in claim 10 wherein said interconnecting means includes means for pivotally interconnecting said first and second support members.

12. Medical examination apparatus as defined in claim 1 wherein said NMR means comprises magnetic resonance spectroscopy means for production of spectroscopic data in response to the detected NMR signals.

13. A method of acquiring in-vivo NMR data from a region of a subject affected by motion of a body part such as a joint of the subject, employing NMR apparatus having an NMR pulse sequence for producing a magnetic resonance phenomenon in the region and for acquiring the magnetic resonance data in response to said magnetic resonance phenomenon, the method comprising the steps of:
    producing movement of the body part along a path,
    producing master timing signals in response to different positions of the body part along said path at a plurality of points in travel,
    employing the master timing signals to synchronize the NMR pulse sequence with the positions of the body part and acquiring the magnetic resonance data from the region during the movement of the body part when the body part is at the plurality of different positions along said path.

14. A method as defined in claim 13 wherein the magnetic resonance data are obtained from the region which includes said body part.

15. A method as defined in claim 14 which includes, using the magnetic data, forming separate images of the region with the body part at said different positions, and
    sequentially displaying the separate images for motion picture display of the region.

16. A method as defined in claim 13 wherein the step of producing movement of the body part includes driving said body part for movement along said path by motor means operatively connected to said subject.

17. A method as defined in claim 13 including deriving spectroscopic data from the magnetic resonance data, and displaying said spectroscopic data.

18. A method as defined in claim 13 including application of loading forces to the body part during at least a portion of said movement thereof while acquiring said magnetic resonance data.

19. A method as defined in claim 18 wherein the loading forces applied to the body part are provided by voluntary muscle action of the subject.

20. A method as defined in claim 13 wherein movement of the body part is produced by voluntary muscle action of the subject.

* * * * *